(12) United States Patent
Rausch et al.

(10) Patent No.: US 12,457,891 B2
(45) Date of Patent: Oct. 28, 2025

(54) METHOD FOR PRODUCING AN ORGANIC ELECTRONIC COMPONENT

(71) Applicant: Pictiva Displays International Limited, Dublin (IE)

(72) Inventors: Andreas Rausch, Regensburg (DE); Niels Gerlitzki, Augsburg (DE)

(73) Assignee: Pictiva Displays International Limited, Dublin (IE)

( * ) Notice: Subject to any disclaimer, the term of this patent is extended or adjusted under 35 U.S.C. 154(b) by 0 days.

(21) Appl. No.: 18/098,182

(22) Filed: Jan. 18, 2023

(65) Prior Publication Data

US 2023/0180494 A1 Jun. 8, 2023

Related U.S. Application Data

(60) Division of application No. 16/925,627, filed on Jul. 10, 2020, now Pat. No. 11,594,696, which is a (Continued)

(30) Foreign Application Priority Data

May 24, 2017 (DE) .......................... 102017111425.4

(51) Int. Cl.
*H10K 71/30* (2023.01)
*H10K 50/11* (2023.01)
(Continued)

(52) U.S. Cl.
CPC ............. *H10K 71/30* (2023.02); *H10K 50/11* (2023.02); *H10K 50/12* (2023.02); *H10K 50/15* (2023.02);
(Continued)

(58) Field of Classification Search
None
See application file for complete search history.

(56) References Cited

U.S. PATENT DOCUMENTS 8,278,652 B2 10/2012 Krause et al.
9,263,696 B2 2/2016 Kellermann et al.
(Continued)

FOREIGN PATENT DOCUMENTS

CN 104157797 A * 11/2014 ............. H01L 51/56
DE 102007028237 A1 12/2008
(Continued)

OTHER PUBLICATIONS

English machine translation PDF of Kessler (DE-102015119778-A1) accessed online from Espacenet. (Year: 2017).*
(Continued)

*Primary Examiner* — Katie L. Hammer
(74) *Attorney, Agent, or Firm* — Botos Churchill IP Law LLP

(57) ABSTRACT

A method for producing an organic electronic component. According to the method, an anode is provided. A first layer is applied to the anode, which acts in a hole injecting manner and has a first matrix material and a dopant embedded therein. The dopant is a p-type dopant having at least one material which has a lewis acidity at least partially or completely with regard to the matrix material. A second layer is applied to the first layer, the second layer acts in a hole-transporting manner to the first layer which acts in a hole-transporting manner. At least one light-emitting layer is applied to the second layer. A cathode is applied to the light-emitting layer.

13 Claims, 3 Drawing Sheets

Related U.S. Application Data continuation of application No. 15/979,281, filed on May 14, 2018, now Pat. No. 10,854,834.

(51) Int. Cl.

| | | |
|---|---|---|
| *H10K 50/12* | (2023.01) | |
| *H10K 50/15* | (2023.01) | |
| *H10K 50/155* | (2023.01) | |
| *H10K 50/16* | (2023.01) | |
| *H10K 50/165* | (2023.01) | |
| *H10K 50/17* | (2023.01) | |
| *H10K 50/18* | (2023.01) | |
| *H10K 50/81* | (2023.01) | |
| *H10K 50/82* | (2023.01) | |
| *H10K 71/00* | (2023.01) | |
| *H10K 85/60* | (2023.01) | |
| *H10K 101/40* | (2023.01) | |
| *H10K 102/10* | (2023.01) | |

(52) U.S. Cl.
CPC ......... *H10K 50/155* (2023.02); *H10K 50/156* (2023.02); *H10K 50/16* (2023.02); *H10K 50/165* (2023.02); *H10K 50/166* (2023.02); *H10K 50/171* (2023.02); *H10K 50/18* (2023.02); *H10K 50/81* (2023.02); *H10K 50/82* (2023.02); *H10K 71/00* (2023.02); *H10K 85/649* (2023.02); *H10K 50/17* (2023.02); *H10K 50/181* (2023.02); *H10K 2101/40* (2023.02); *H10K 2102/103* (2023.02); *Y02E 10/549* (2013.01)

(56) References Cited

U.S. PATENT DOCUMENTS

| | | | |
|---|---|---|---|
| 9,627,641 B2 | 4/2017 | Schmid et al. | |
| 9,797,567 B2 | 10/2017 | Kastner-Jung et al. | |
| 9,929,362 B2 | 3/2018 | Maltenberger et al. | |
| 2002/0040728 A1 | 4/2002 | Yoshikawa | |
| 2003/0170491 A1 | 9/2003 | Liao et al. | |
| 2007/0029556 A1* | 2/2007 | Su .................. | H10K 50/17 257/E33.037 |
| 2007/0052351 A1 | 3/2007 | Kim et al. | |
| 2007/0077594 A1 | 4/2007 | Hikmet et al. | |
| 2008/0067924 A1 | 3/2008 | Prakash et al. | |
| 2009/0256117 A1 | 10/2009 | Seshadri et al. | |
| 2010/0308306 A1 | 12/2010 | Schmid et al. | |
| 2011/0086176 A1 | 4/2011 | Yoon et al. | |
| 2011/0089408 A1 | 4/2011 | Schmid et al. | |
| 2011/0309307 A1* | 12/2011 | Zeika .................. | C07D 497/14 252/500 |
| 2012/0080086 A1 | 4/2012 | Yoon et al. | |
| 2012/0192945 A1 | 8/2012 | Kuhn et al. | |
| 2013/0009137 A1 | 1/2013 | Brown et al. | |
| 2013/0063023 A1 | 3/2013 | Pan et al. | |
| 2013/0334516 A1 | 12/2013 | Weiss et al. | |
| 2014/0034934 A1 | 2/2014 | Kellermann et al. | |
| 2014/0048785 A1 | 2/2014 | Heuser et al. | |
| 2014/0077189 A1 | 3/2014 | Kugler et al. | |
| 2014/0116509 A1 | 5/2014 | Vail et al. | |
| 2014/0264313 A1* | 9/2014 | Schmid .................. | H05B 33/14 556/113 |
| 2015/0123047 A1 | 5/2015 | Maltenberger et al. | |
| 2015/0171359 A1 | 6/2015 | Forrest et al. | |
| 2016/0056400 A1 | 2/2016 | Kim et al. | |
| 2016/0079316 A1 | 3/2016 | Zhou et al. | |
| 2017/0069864 A1 | 3/2017 | Lee et al. | |
| 2017/0301872 A1 | 10/2017 | Schmid et al. | |
| 2018/0019397 A1 | 1/2018 | Kaiser et al. | |
| 2018/0108849 A1* | 4/2018 | Schmid .................. | H05B 33/14 |
| 2018/0331308 A1 | 11/2018 | Kessler et al. | |
| 2018/0342692 A1 | 11/2018 | Rausch et al. | |

FOREIGN PATENT DOCUMENTS

| | | | | |
|---|---|---|---|---|
| DE | 102007028238 A1 | 12/2008 | | |
| DE | 102007028236 A1 | 1/2009 | | |
| DE | 102010041331 A1 | 3/2012 | | |
| DE | 102010056519 A1 | 6/2012 | | |
| DE | 102012209520 A1 | 12/2013 | | |
| DE | 102012209523 A1 | 12/2013 | | |
| DE | 102013114484 A1 | 7/2014 | | |
| DE | 102014114224 A1 | 3/2016 | | |
| DE | 102014114231 A1 | 3/2016 | | |
| DE | 102015119778 A1 * | 5/2017 | | |
| DE | 102015121844 A1 | 6/2017 | | |
| EP | 2656412 A1 | 10/2013 | | |
| EP | 3133663 A1 | 2/2017 | | |
| EP | 3133664 A1 | 2/2017 | | |
| JP | 2013039817 A | 2/2013 | | |
| WO | 2008154914 A1 | 12/2008 | | |
| WO | 2010066245 A1 | 6/2010 | | |
| WO | 2012104742 A1 | 8/2012 | | |
| WO | 2014191767 A1 | 12/2014 | | |
| WO | 2015088999 A1 | 6/2015 | | |
| WO | WO-2016188604 A1 * | 12/2016 | ........... | H01L 51/002 |
| WO | 2017029366 A1 | 2/2017 | | |
| WO | 2017029370 A1 | 2/2017 | | |

OTHER PUBLICATIONS

English machine translation of Sun et al. (CN 104157797 A) accessed online from Espacenet; PDF pp. 1-18. (Year: 2014).*

Earle, MJ, et al. "Metal bis {(trifluoromethyl) sulfonyl} amide complexes: highly efficient Friedel-Crafts acylation catalysts" Chemical Communications. 2004(12):1368-9.

Kalyanasundaram, Kuppuswamy. "Dye-sensitized Solar Cells" CRC press; Aug. 3, 2010.

Koppel, IA, et al. The acidity of some neutral NH-acids in water and dimethyl sulfoxide. Journal of chemical research. Synopses (Print). 1994(6):212-3.

Notice of Allowance issued Apr. 14, 2020 in U.S. Appl. No. 15/979,281.

Office Action issued Dec. 31, 2019 in U.S. Appl. No. 15/979,281.

Office Action issued Jun. 25, 2019 in U.S. Appl. No. 15/979,281.

Pitula, S, et al. Synthesis, structure, and physico-optical properties of manganate (11)-based ionic liquids. Chemistry—I\ European Journal. Mar. 15, 2010;16(11):3355-65.

Snaith., HJ, et al. Enhanced charge mobility in a molecular hole transporter via addition of redox inactive ionic dopant implication to dye-sensitized solar cells. Applied physics letters. Dec. 25, 2006;89(26):262114.

Stricker, M, et al. Copper (I) and Silver (I) Bis (trifluoromethanesulfonyl) imide and Their Interaction with an Arene, Diverse Olefins, and an NTf2-Based Ionic Liquid. Chemistry—A European Journal. Jan. 14, 2013;19(3):1042-57.

Office Action from corresponding German Patent Application No. 102017111425.4 dated Oct. 5, 2023 (15 pp.).

Third Party Submission from corresponding German Patent Application No. DE 102017111425 A1 dated Apr. 26, 2024 (55 pp.).

* cited by examiner

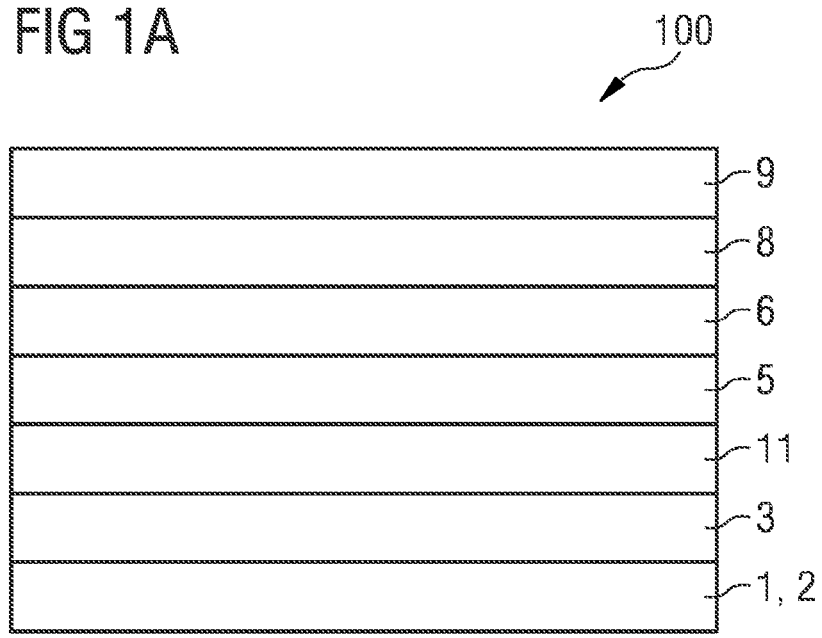
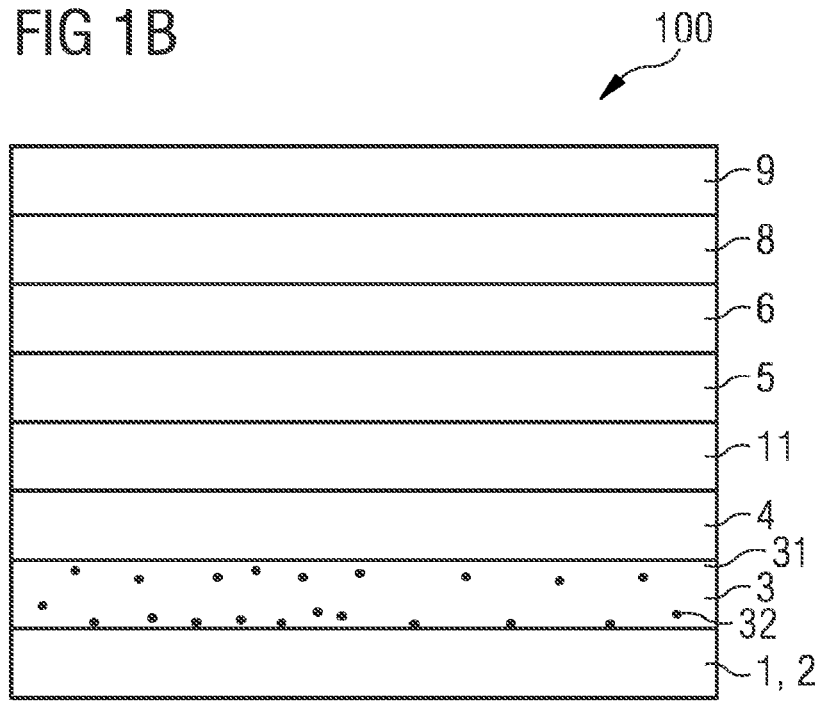

FIG 2

| 30mA/cm² | | | L (cd/m²) | Peff (lm/W) | leff (cd/A) | EQE (%) | U (V) |
|---|---|---|---|---|---|---|---|
| 3% R | | V | 1159 | 4.0 | 5.8 | 13.25 | 4.56 |
| 1% Cu-TFSI | | | 1082 | 3.8 | 5.4 | 12.13 | 4.52 |
| 3% Cu-TFSI | V | | 1060 | 3.6 | 5.3 | 11.89 | 4.67 |
| 5% Cu-TFSI | | | 1031 | 3.6 | 5.2 | 11.55 | 4.48 |
| 1% Cu-TFSI | | | 1128 | 3.7 | 5.6 | 12.63 | 4.78 |
| 3% Cu-TFSI | | A | 954 | 3.1 | 4.8 | 10.66 | 4.89 |
| 5% Cu-TFSI | | | 837 | 2.7 | 4.2 | 9.34 | 4.92 |

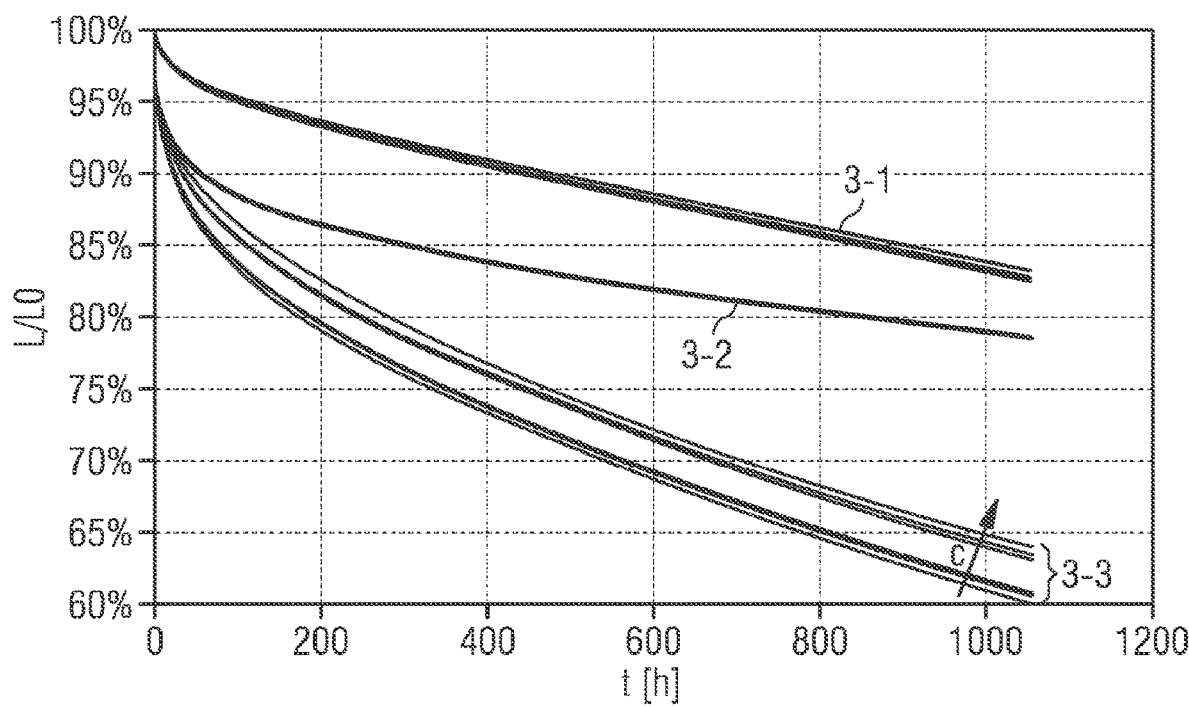

METHOD FOR PRODUCING AN ORGANIC ELECTRONIC COMPONENT

CROSS-REFERENCE TO RELATED APPLICATIONS

This application is a divisional of U.S. application Ser. No. 16/925,627, filed Jul. 10, 2020, which is a continuation of, and claims priority to and the benefit of. U.S. patent application Ser. No. 15/979,281, filed on May 14, 2018 now U.S. Pat. No. 10,854,834 which issued on Dec. 1, 2020 which claims priority to and the benefit of German Patent Application No. 102017111425.4, filed on May 24, 2017, the disclosure of which is incorporated herein by reference.

DESCRIPTION

The invention relates to an organic electronic component. The invention further relates to a method for producing an organic electronic component.

In organic electronic components, such as, for example, organic transistors, organic light-emitting diodes, organic light-emitting electrochemical cells, organic solar cells and organic photodetectors, so-called charge transporting layers and/or charge injecting layers are required in order to ensure a stable charge transport and/or injection.

In light-emitting diodes, these described layers can be used both as transport layers and as charge generation layers. In order to increase the efficiency of the components, the charge-injecting layers are generally admixed with a dopant, in order to increase the charge transport and/or charge injection into the at least one light-emitting layer. In particular, p-type dopants are used for hole-injection layers and/or hole-transport layers, such as, for example, the NDP-2 or NDP-9 offered by Novaled. However, a disadvantage of these p-type dopants is that these dopants are very expensive.

It is also known that the p-doping of the hole-injection layers is possible with the aid of lewis acids. For example, the use of metal salts of fluorinated sulfonimides as p-dopants for conductivity doping in commercially available hole conductors can be used. In organic light-emitting diodes these materials help achieve a sufficiently good efficiency; however, these components have a significantly shorter service life.

The aim of the invention is to provide an organic electronic component which has an increased service life. A further object of the invention is to provide a method for producing an organic electronic component which generates a component having an increased service life.

In at least one embodiment, the organic electronic component comprises a cathode, an anode, at least one light-emitting layer, a first layer and a second layer. The at least one light-emitting layer is arranged between the anode and the cathode. The first layer comprises a first matrix material. The first layer additionally has at least one dopant. The second layer has a second matrix material. The first layer is arranged in particular between the second layer and the anode. The second layer is arranged in particular between the anode and the at least one light-emitting layer. The dopant is a fluorinated sulfonimide metal salt of the following formula 1:

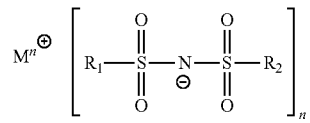

wherein M is either a divalent or higher-valent metal having an atomic mass of greater than 26 g/mol or a monovalent metal having an atomic mass of greater than or equal to 6 g/mol or greater than or equal to 39 g/mol.

wherein $1 \leq n \leq 7$, and wherein $R_1$, $R_2$ are selected independently of one another and from a group comprising a fluorine-substituted aryl radical, a fluorine-substituted alkyl radical and a fluorine-substituted arylalkyl radical.

The first and second layers can also be formed as one layer, in particular if both layers have the same matrix material. In this case, the layer acts in a hole injecting and/or hole transporting manner and comprises an interface doping with the dopant, in particular on the anode side. The interface doping preferably extends in this layer to at least 5 nm or 10 nm and to a maximum of 50 nm. Said layer has, in particular, a layer thickness of 50 to 320 nm. Interface doping means in particular that only at least one interface of the layer is doped with the dopant, while the main part of the one layer is undoped. The layer thickness of the one layer is preferably greater than the penetration depth of the dopant into this layer by a factor of 2.5; 5; 10; 15; 20; 25 or 30. For example, the dopant in the one layer has a penetration depth of at most 20 nm with a layer thickness of the layer of 300 nm (factor 15).

If, as an alternative, said one layer is formed as a first layer and second layer, the first and/or second layer act in a hole injecting manner and/or in a hole transporting manner. In particular, the first layer is doped over the full surface area or completely doped with the dopant, while the second layer is undoped.

The inventors have found that the use of an organic electronic component described here, in particular with the layer architecture described here, a component having a long service life and at least the same or better efficiency than previously known commercially available components can be made available.

In contrast to this, previously known components for hole injection and/or hole transport comprise layers which are completely doped with a p-type dopant.

The inventors have found that the combination of the first layer with a first matrix material and a p-type dopant and a second layer with a second matrix material, which is, in particular, free of this p-type dopant, a component having a long service life can be produced. The first layer is preferably arranged adjacent to the anode. The second layer preferably has a layer thickness which is greater than the layer thickness of the first layer by a factor of 2.5; 5; 10; 15; 20; 25 or 30.

In other words, a layer stack or a layer for hole transport and/or hole injection is provided between the anode and the at least one light-emitting layer, the regions doped with the dopant have undoped regions on the anode side and on the side of the light-emitting layer.

The doped region facing the anode is preferably only a few nanometers thick, preferably between 5 nm or 10 nm to 20 nm. "5 nm or 10 nm to 20 nm" means here and below that the doped region can have a thickness of between 5 nm and 20 nm or 10 nm to 20 nm. The majority of this layer system is or has an undoped (second) matrix material.

Surprisingly, the inventors have found that this boundary surface doping of the hole transport layer in comparison to a completely doped layer acts to an extremely strong improving of the service life by the boundary surface doping of the organic electronic component. The service life of such a component is higher compared to a reference component, which has, for example, a p-type dopant NDP-9. The increase in the service life preferably occurs even at low concentrations of the dopant, for example at a concentration of 1% by volume. The production and provision of an efficient and long-lived organic electronic component with a small amount of dopant is thus made possible. This saves dopant material and costs.

The invention further relates to a method for producing an organic electronic component. The component described here is preferably produced by means of the method. All embodiments and definitions for the component also apply to the method and vice versa.

According to at least one embodiment, the method for producing an organic electronic component comprises at least the following steps:
A) Provision of an anode.
B) Applying a first layer to the anode which acts as a hole injecting layer and has a first matrix material and a dopant embedded therein,
wherein the dopant has a fluorinated sulfonimide metal salt of the following formula 1:

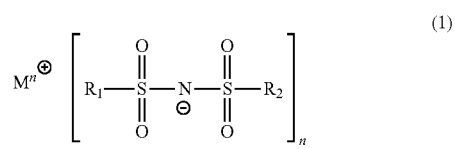

wherein M is either a divalent or higher-valent metal having an atomic mass of greater than 26 g/mol or a monovalent metal having an atomic mass of greater than or equal to 6 g/mol or greater than or equal to 39 g/mol.
wherein $1 \leq n \leq 7$, and
wherein $R_1$, $R_2$ are selected independently of one another and from a group consisting of a fluorine-substituted aryl radical, a fluorine-substituted alkyl radical and a fluorine-substituted arylalkyl radical,
wherein the dopant has a proportion between 1 vol. % including and 30 vol. % including in the first matrix material.
C) Applying a second layer on the first layer which acts in a hole-transporting manner,
D) Applying at least one light-emitting layer on the second layer, and
E) Applying a cathode to the light-emitting layer.

The fact that a layer or an element acts in a hole-injecting and/or hole-transporting manner means here and in the following that this layer or the element has the hole injection and/or the hole transport as a main function. This does not exclude that a layer having a hole-injecting effect has also hole-transporting properties or a hole-transporting layer can have hole-injecting properties.

According to at least one embodiment, the first layer has a dopant. The dopant is a fluorinated sulfonimide metal salt, i.e. has a metal cation and one or more sulfonimide anions. The sulfonimide anion is simply negatively charged. The metal cation is n-times positively charged and correspondingly requires n fluorinated sulfonimide anions in order to form a neutral metal salt. In particular, n has a value between 1 and 4 inclusive, particularly preferably between 1 and 2 inclusive. Higher-valent metal cations can in particular have a better doping effect, because the lewis acid character is better pronounced. In particular, oxidizing cations, such as $Fe^{3+}$, are rather undesirable.

According to at least one embodiment, M is selected from a group of: copper, zinc, aluminum, bismuth, potassium, rubidium, cesium and tin.

Alternatively or additionally, the radicals $R_1$ and/or $R_2$ can each be independent of one another and can be selected from a group consisting of a linear or branched, at least partially fluorine-substituted alkyl radical having 1 to 10 carbon atoms, an at least partially fluorine-substituted aryl radical having 1 to 20 carbon atoms and an at least partially fluorine-substituted arylalkyl radical having 1 to 20 carbon atoms.

The radicals $R_1$ and/or $R_2$ can in each case be a trifluoromethane. This allows fluorinated sulfonimide metal salts, i.e., in particular, trifluoromethanesulfonimide metal salts (TFSI), such as, for example, $Sn(TFSI)_4$, $Zn(TFSI)_2$, $Cu(TFSI)_2$ and $K(TFSI)$. These metal salts are commercially available and are particularly easily accessible. These metal salts can influence the electrical properties of organic matrix materials, for example of the first matrix material, when the first matrix material, for example, is doped with the dopant.

Preferably, M=copper. Additionally or alternatively, n=2.

The fluorinated sulfonimide metal salts described here do not belong to the superacids, since the sulfonimide metal salts have an acid constant value Pks>0. Superacids have in particular a Pks value of <0. A decisive advantage compared to superacids is that the fluorinated sulfonimide metal salts can be vaporized without decomposition and can thus be provided by sublimation in the required high purity and can be used in the vacuum process.

According to at least one embodiment, $R_1$ and $R_2$ are selected from the same substituents and from the following group.

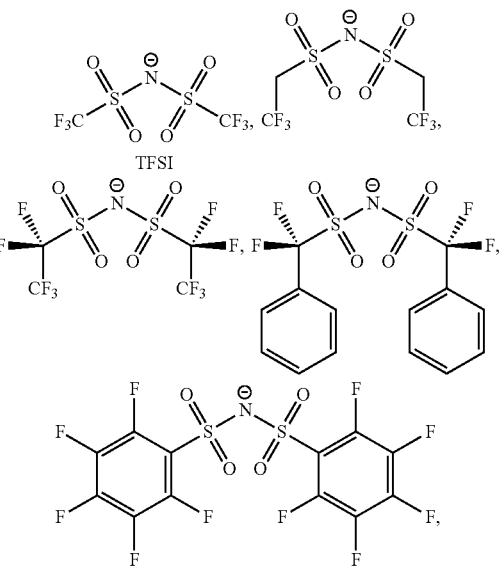

-continued

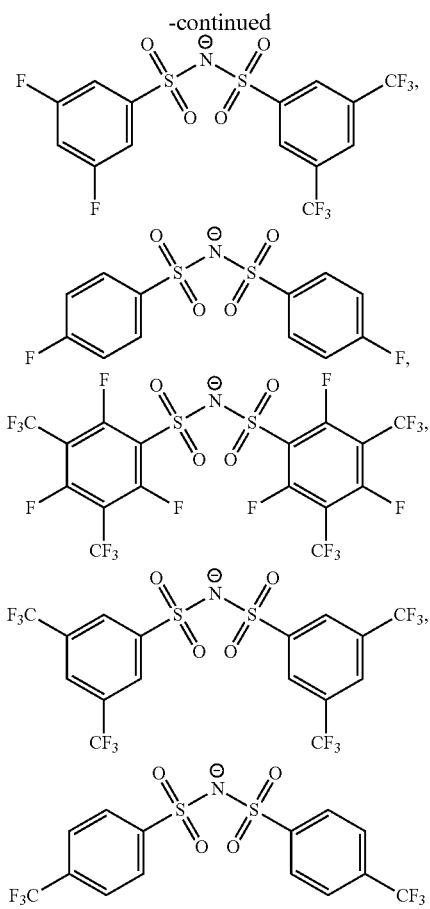

According to at least one embodiment, the sulfonimide anion is selected from the following group:

In this case, the formulae which are just illustrated for the sulfonimide anion should only be exemplary and serve for illustration purposes. These sulfonimide anions are not intended to limit the scope of the invention. Within the scope of the invention, several identical or different fluorinated sulfonimide anions can be bound to form a metal centre $M^{n+}$. The coordination of individual sulfonimide anions can also be different. For example, an anion can only be bound to the metal simply by means of oxygen. Alternatively, the connection can also be carried out twice via different oxygen atoms. The connection via a nitrogen or a sulfur of the fluorinated sulfonimide anion is also conceivable. The metal salt can form an anionic bond and/or a complex compound. For example, the coordination of the sulfonimide anions can be effected via two oxygen atoms to the metal. This can also be referred to as chelating.

According to at least one embodiment, M is selected from the group consisting of divalent or higher-valent metals having an atomic mass of greater than 26 g/mol. The positive charge on the metal can in particular assume a value between 2 and 7 inclusive and is compensated in particular by n simply negatively charged perfluorinated sulfonimide anions. Preferably, n assumes a value between 2 and 4 inclusive. Particularly preferably, n is equal to 2. The radicals $R_1$ and $R_2$ are in particular a linear or branched, partially or completely fluorinated alkyl substituent having 1 to 10 carbon atoms, a partially or completely fluorinated aryl substituent having 1 to 20 carbon atoms or a partially or completely fluorinated arylalkyl substituent having 1 to 20 carbon atoms.

According to at least one embodiment, M is selected from the group of monovalent metals having an atomic mass of ≥6 g/mol or ≥39 g/mol. The positive charge on the metal assumes in particular a value of 1 and is compensated in particular by a single negatively charged perfluorinated sulfonimide anion. The radicals $R_1$ and $R_2$ are selected in particular from a group consisting of a linear or branched, partially or completely fluorinated alkyl substituent having 1 to 10 carbon atoms, a partially or completely fluorinated aryl substituent having 1 to 20 carbon atoms and a partially or completely fluorinated alkylaryl substituent having 1 to 20 carbon atoms.

According to at least one embodiment, the first layer and/or second layer are/is formed as a hole-injection layer and/or hole transport layer. In addition, the hole-injection layer and/or hole-transport layer can consist of or contain the dopant. In other words, the main task of the first layer is to inject the holes and/or the main task of the second layer is to transport the holes.

According to at least one embodiment, the first layer is formed in a hole injecting manner. The main task of this is therefore to inject holes. The first layer comprises a first matrix material and, in particular embedded therein, at least the one dopant. The dopant is preferably formed as a p-type dopant, i.e. as a fluorinated sulfonimide metal salt.

According to at least one embodiment, the first layer is hole injecting, wherein the fluorinated sulfonimide metal salt is a p-type dopant, which acts as an electron acceptor in relation to the first matrix material.

In particular, a coordinative binding with a binding and an anti-binding orbital is formed.

Within the meaning of the present invention, the designation 'p-type dopant' comprises, in particular, materials, which have a lewis acidity at least partially or completely with regard to the matrix material or act as lewis acid and/or are capable to form bonds, in particular covalent, ionic or coordinative bonds, to the matrix material, preferably to the first matrix material, in which these materials, if only formal, act as lewis acids.

According to at least one embodiment, the first and/or second matrix material are/is a hole-transport and/or hole-injection material.

According to at least one embodiment, the first and/or second matrix material are selected independently of one another from a group consisting of HTM014, HTM081, HTM163, HTM222, NHT5, NHT49, NHT51, EL-301, EL-22T, HTM226, HTM355, HTM133, HTM334 and HTM604.

According to at least one embodiment, the dopant is a p-type dopant. Alternatively or additionally, the dopant has a proportion of between 1% by volume and 30% by volume in the first matrix material or first layer. The dopant preferably has a proportion of between 1% by volume and 5% by volume, for example between 1.5% by volume and 4.5% by volume, for example 3% by volume, in the first matrix material or the first layer.

According to at least one embodiment, the first layer has a layer thickness of less than 50 nm. The first layer preferably has a layer thickness of 5 to 45 nm, preferably 10 to 30 nm, preferably 10 to 20 nm, for example 15 nm.

Alternatively or additionally, the second layer has a layer thickness which is greater than the layer thickness of the first layer.

According to at least one embodiment, the second layer has a layer thickness which is greater than the layer thickness of the first layer by a factor of 2.5, 5, 10, 15, 20 or 30. The second layer preferably has a layer thickness of 50 nm to 300 nm, for example 60 nm to 250 nm, particularly preferably 75 nm to 225 nm, for example 150 nm.

The degree of doping of the first layer can be adapted to the charge transport or to the charge injection required for the component. In the components, in particular in organic light-emitting diodes, a balanced charge transport is important, that is to say an equilibrium has to be present between electrons and holes. For generating light in a light-emitting layer of an organic light-emitting diode (OLED), for example, an exciton formed from a hole and an electron for the emission of light is necessary, so that as many electrons and holes as possible should be present in the light-emitting layer in order to obtain an efficient component. The service life of the component can also be improved by a good charge balance, since excess charge carriers, for example holes or radicals, can lead to degradation, for example oxidation, of the materials.

The fact that a layer "is arranged between two other layers" can mean here and below that the one layer is arranged directly, in direct mechanical and/or electrical contact, with one of the two other layers. Alternatively, it can also mean that the one layer is in indirect contact with one of the two other layers and in direct mechanical and/or electrical contact or in indirect contact with other layers. In the case of indirect contact, further layers can then be arranged between the one and at least one of the two other layers.

According to at least one embodiment, the first layer is formed as a hole injection layer. The first layer is arranged directly on the anode. In other words, the first layer adjoins the anode directly, i.e. is in direct mechanical and/or electrical contact. The second layer is preferably arranged directly on the first layer or directly adjoins the first layer. The second layer is formed as a hole-transport layer. In other words, the first layer is preferably arranged directly on the anode and directly on the second layer.

According to at least one embodiment, the first matrix material and the second matrix material are identical. The second layer preferably has no dopant. The second layer is thus free of the dopant. Alternatively or additionally, the second layer has no further dopant.

According to at least one embodiment, the first and the second matrix material are identical, wherein the second layer is free of the dopant and/or a further dopant, wherein the dopant in the first layer has a proportion of between 1% by volume and 30% by volume in the first matrix material or the first layer, wherein the first layer has a layer thickness of less than 50 nm and wherein the second layer has a layer thickness of 50 to 300 nm.

In other words, a hole injection and hole transport system is provided here as a layer stack, which has an undoped second layer and a doped first layer. The doped first layer is arranged adjacent to the anode and is arranged between the second layer and the anode. In other words, the first layer forms a so-called interface doping of the layer sequence comprising the first and second layers. The interface doping with the dopant, which is in particular a p-type dopant, and the subsequent arrangement of the undoped hole transport layer brings about an increase in the service life with at least the same efficiency compared to conventional components.

According to at least one embodiment, the first layer is produced by co-deposition of the first matrix material and the dopant via vapour deposition.

According to at least one embodiment, the first layer is produced by means of a wet-chemical method.

According to at least one embodiment, the first matrix material and the dopant can be used both in the gas phase and in the liquid phase, that is to say in a wet-chemical process. During the gas phase deposition, both the dopant and the first matrix material are jointly used, preferably from different sources in the high vacuum, are vaporized and deposited as a first layer. During processing from the liquid phase, the p-type dopant and the matrix material are dissolved with a solvent and by means of printing techniques, spin coating, knife coating, slot coating. The finished layer is obtained by evaporation of the solvent. In this case, any doping ratios can be set by the different mass ratios of dopant and first matrix material.

The second layer can subsequently be produced by means of physical vapor deposition or a wet chemical method.

In principle, all matrix materials which can be separated from the gas phase are possible. The following matrix materials can preferably be processed by means of a solvent process or wet chemical process:

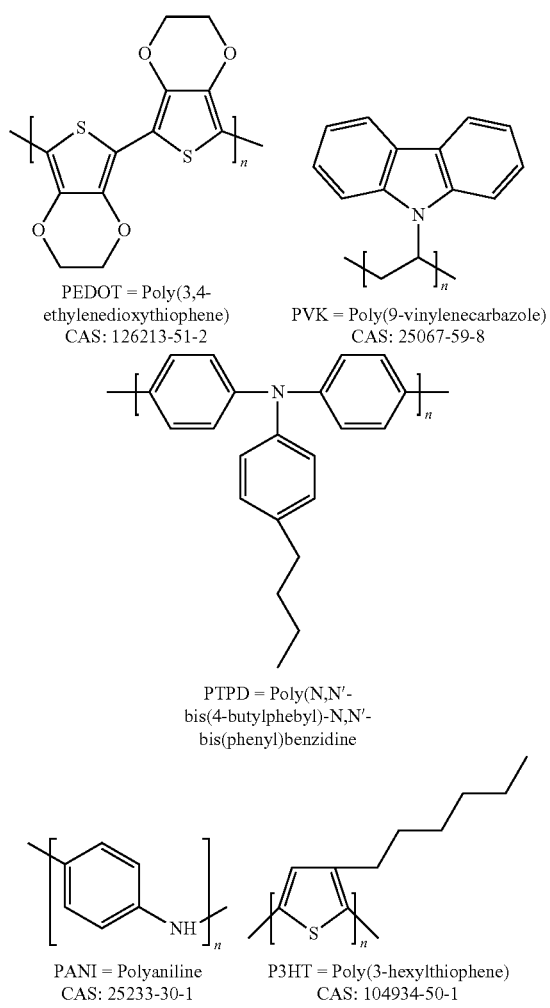

PEDOT = Poly(3,4-ethylenedioxythiophene)
CAS: 126213-51-2

PVK = Poly(9-vinylenecarbazole)
CAS: 25067-59-8

PTPD = Poly(N,N'-bis(4-butylphebyl)-N,N'-bis(phenyl)benzidine

PANI = Polyaniline
CAS: 25233-30-1

P3HT = Poly(3-hexylthiophene)
CAS: 104934-50-1

Furthermore, matrix materials which are referred to as "small molecules" can particularly preferably be processed by means of a solvent process. This substance class is known to the person skilled in the art and includes, for example, (2,2',7,7-Tetrakis-(N,N-diphenylamino)-9,9'-spirobifluorene) and Spiro-TTB (2,2',7,7'-Tetrakis-(N,N'-di-p-methylphenylamino)-9,9'-spirobifluorene and further materials such as are listed in this application as matrix materials.

According to at least one embodiment, the first and/or second matrix material of the organic electronic component comprises one or more of the following materials, which can be used, for example, in a hole-transporting layer:

N,N'-Bis(naphthalen-1-yl)-N,N'-bis(phenyl)-9,9-dimethylfluorene,
N,N-Bis(3-methylphenyl)-N,N'-bis(phenyl)-9,9-dimethylfluorene,
N,N-Bis(naphthalen-1-yl)-N,N'-bis(phenyl)-9,9-dimethylfluorene,
N,N'-Bis(naphthalen-1-yl)-N,N-bis(phenyl)-2,2-dimethylbenzidine,
N,N'-Bis(3-methylphenyl)-N,N-bis(phenyl)-9,9-spirobifluorene,
2,2',7,7'-Tetrakis(N,N-diphenylamino)-9,9'-spirobifluorene,
N,N-Bis(naphthalen-1-yl)-N,N'-bis(phenyl)-benzidine,
N,N'-Bis(naphthalen-2-yl)-N,N'-bis(phenyl)-benzidine,
N,N'-Bis(3-methylphenyl)-N,N-bis(phenyl)-benzidine,
N,N'-Bis(3-methylphenyl)-N,N-bis(phenyl)-9,9-dimethylfluorene,
N,N'-Bis(naphthalen-1-yl)-N,N-bis(phenyl)-9,9-spirobifluorene,
Di-[4-(N,N-ditolyl-amino)-phenyl]cyclohexane,
2,2',7,7'-tetra(N,N-di-tolyl)amino-spiro-bifluorene,
9,9-Bis[4-(N,N-bis-biphenyl-4-yl-amino)phenyl]-9H-fluorene,
2,2',7,7'-Tetrakis(N,N-naphthalenyl(phenyl)-amino]-9,9'-spirobifluorene,
2,7-Bis(N,N-bis(9,9-spiro-bifluorene-2-yl)-amino]-9,9'-spirobifluorene,
2,2'-Bis(N,N-bis(biphenyl-4-yl)amino]-9,9'-spirobifluorene,
N,N'-bis(phenanthren-9-yl)-N,N'-bis(phenyl)-benzidine,
N,N,N',N'-tetra-naphthalen-2-yl)-benzidine,
2,2'-Bis(N,N-di-phenyl-amino)-9,9-spirobifluorene,
9,9-Bis[4-(N,N-bis-naphthalen-2-yl-amino)phenyl]-9H-fluorene,
9,9-Bis[4-(N,N-bis-naphthalen-2-yl-N,N'-bis-phenyl-amino)-phenyl]-9H-fluorene,
titanium oxide phthalocyanine,
copper phthalocyanine,
2,3,5,6 Tetrafluoro 7,7,8,8, tetracyano-quinodimethane,
4,4',4"-Tris(N-3-methylphenyl-N-phenyl-amino)triphenylamine,
4,4',4"-Tris(N-(2-naphthyl)-N-phenyl-amino)triphenylamine,
4,4',4"-Tris(N-(1-naphthyl)-N-phenyl-amino)triphenylamine,
4,4',4"-Tris(N,N-diphenyl-amino)triphenylamine,
Pyrazino[2,3-f][1,10]phenanthroline-2,3-dicarbonitrile,
N,N,N',N'-Tetrakis(4-methoxyphenyl)benzidine, However, the possible first and/or second matrix materials are not restricted to said materials. Other materials, such as the commercially available matrix materials from Merck, Novaled, Lumtec, Sensient, and Hodogaya with the product designations HTM014. HTM081, HTM163, HTM4222, NHT5, NHT49, NHT51, EL-301, EL-22T are particularly well suited. However, comparable commercially available materials can also be used.

According to at least one embodiment, the component has an electron-blocking layer. The electron-blocking layer is preferably arranged between the at least one light-emitting layer and the second layer. Preferably, no further layers or elements are arranged between the light-emitting layer and the electron-blocking layer and between the electron-blocking layer and the second layer.

Typical matrix materials of an electron-blocking layer are in this case:
2,2',2"-(1,3,5-Benzinetriyl)-tris(1-phenyl-1-H-benzimidazole),
2-(4-Biphenylyl)-5-(4-tert-butylphenyl)-1,3,4-oxadiazole,
2,9-Dimethyl-4,7-diphenyl-1,10-phenanthroline,
8-Hydroxyquinolinolato-lithium,
4-(Naphthalen-1-yl)-3,5-diphenyl-4H-1,2,4-triazole,
1,3-Bis[2-(2,2'-bipyridine-6-yl)-1,3,4-oxadiazo-5-yl]benzene,
4,7-Diphenyl-1,10-phenanthroline,
3-(4-Biphenylyl)-4-phenyl-5-tert-butylphenyl-1,2,4-triazole,
Bis(2-methyl-8-quinolinolate)-4-(phenylphenolato)aluminum,
6,6'-Bis[5-(biphenyl-4-yl)-1,3,4-oxadiazo-2-yl]-2,2'-bipyridylen,
2-phenyl-9,10-di(naphthalene-2-yl)-anthracene,
2,7-Bis[2-(2,2'-bipyridine-6-yl)-1,3,4-oxadiazo-5-yl]-9,9-dimethylfluorene,
1,3-Bis[2-(4-tert-butylphenyl)-1,3,4-oxadiazo-5-yl]benzene,
2-(naphthalen-2-yl)-4,7-diphenyl-1,10-phenanthroline,
Tris(2,4,6-trimethyl-3-(pyridin-3-yl)phenyl)borane,
1-methyl-2-(4-(naphthalen-2-yl)phenyl)-1H-imidazo[4,5-f][1,10]phenanthroline.

Blocking and limiting the electron flow is of high importance, for example, for highly efficient organic light-emitting diodes.

According to at least one embodiment, the component has two electrodes, an anode and a cathode. The anode can be arranged, for example, on the substrate. At least one organic light-emitting layer or a plurality of functional layers of organic materials can be applied above the anode. A cathode can then be arranged downstream of the at least one light-emitting layer. Alternatively, the substrate can also be arranged on the cathode side. For example, the substrate can be glass, quartz, a plastic film metal, metal foils, silicon wafers or other suitable substrate material.

The organic electronic component can be formed as a bottom emitter. This means that the radiation generated in the at least one light-emitting layer can be radiated through the substrate, so that in particular the substrate has a transparency for at least part of said radiation. Advantageously, the anode is then also shaped transparently for this radiation. A transparent anode can, for example, have a transparent conductive oxide or consist of a transparent conductive oxide.

Transparent, electrically conductive oxides (transparent conductive oxides, "TCOs" for short) are transparent, electrically conductive materials, generally metal oxides, such as, for example, zinc oxide, tin oxide, cadmium oxide, titanium oxide, indium oxide or indium tin oxide (ITO) in addition to binary metal-oxygen compounds, such as, for example. ZnO, $SnO_2$ or $In_2O_3$, ternary metal-oxygen compounds, such as, for example. $Zn_2SnO_4$, $CdSnO_3$, $ZnSnO_3$, $MgIn_2O_4$, $GaInO_3$, $Zn_2In_2O_5$ or $In_4Sn_3O_2$ or mixtures of different transparent conductive oxides to the group of TCOs. Furthermore, it can be possible that the TCOs do not necessarily correspond to a stoichiometric composition and can also be p-doped or n-doped.

Alternatively, the organic electronic component can be formed as a top emitter or as a component emitting from both sides.

According to at least one embodiment, the organic electronic component comprises at least one light-emitting layer. The light-emitting layer is designed for producing light in an operating state of an organic light-emitting diode, or to provide charge carriers for a stacked element.

Materials which have a radiation emission on the basis of fluorescence or phosphorescence are suitable as materials for the light-emitting layer. Organic or organometallic compounds, such as derivatives of polyfluorene, are preferably used as organic materials, polythiophene and polyphenylene, for example 2- or 2,5-substituted poly-p-phenylene vinylene and/or metal complexes, for example iridium complexes, such as blue-phosphorescent FIrPic (bis(3,5-difluoro-2-(2-pyridyl)phenyl-(2-carboxypyridyl)-iridium III), green phosphorescent Ir(ppy)$_3$ (tris(2-phenylpyridin)iridium III) and/or red phosphorescent Ru (dtb-bpy)$_3$*2(PF$_6$) (tris [4,4'-di-tert-butyl-(2,2')-bipyridin]ruthenium(III)complex), and blue fluorescent DPAVBi (4,4-bis[4-(di-p-tolylamino) styryl]biphenyl), green fluorescent TTPA (9,10-bis[N,N-di-(p-tolyl)-amino]anthracene and/or red fluorescent DCM2 (4-dicyanomethylen)-2-methyl-6-julolidyl-9-enyl-4H-pyrane) as non-polymeric emitters. The organic light-emitting diode can also have a plurality of light-emitting layers.

The organic electronic component can have layers comprising organic polymers, organic oligomers, organic monomers, organic small non-polymeric molecules (small molecules) or combinations thereof. The organic electronic component can, for example, also have electron-injecting layers, electron-transporting layers and/or hole-blocking layers in addition to the previously mentioned layers. The electron-injecting layers and/or hole-blocking layers are preferably arranged between the at least one light-emitting layer and the cathode. The materials for such layers are known to the person skilled in the art and are therefore not explained in more detail at this point.

According to at least one embodiment, an encapsulation arrangement is arranged above the cathode. The encapsulation protects the organic layers from harmful external influences, such as, for example, moisture, oxygen, hydrogen sulphide or other substances. The encapsulation arrangement is preferably in direct mechanical contact with the cathode.

With regard to the basic structure of an organic light-emitting diode, reference is made to the publication WO 2010/066245 A1, which, in particular with respect to the structure, the layer composition and the materials of the substrate of the anode and of the cathode and of the encapsulation arrangement, are expressly incorporated by reference.

Embodiments relating to the dopant are disclosed in DE 1020121844.5, the disclosure content of which is hereby incorporated by reference.

According to at least one embodiment, the first layer and the second layer have a different matrix material. For example, the first layer can comprise HTM014, HTM081, HTM163, HTM222, NHT5, NHT49, NHT51, EL-301, EL-22T, HTM226, HTM355, HTM133, HTM334 or HTM604 as the first matrix material and the second layer can comprise HTM014, HTM081, HTM163, HTM222, NHT5, NHT49, NHT51, EL-301, EL-22T, HTM226, HTM355, HTM133, HTM334 or HTM604 as the second matrix material.

Alternatively, the matrix materials of the first and second layers can be identical, that is to say the two layers have the same matrix materials. In other words, the first and second layers preferably differ only in that the first layer additionally has a dopant, preferably Cu(TFSI)$_2$.

According to at least one embodiment, the dopant is Cu(TFSI)$_2$.

By using of Cu(TFSI)$_2$ as a dopant, the hole injection is largely independent of the work function of the metal or semiconductor electrode, such as, for example, aluminium or ITO. Cu(TFSI)$_2$ has an exceptionally strong doping effect, owing to the strong lewis acid properties and the oxidic effect. In this case, Cu$^{2+}$ can be reduced to Cu$^{1+}$. The result is a wide selection of dopable hole transport materials. This results from the low-lying LUMO level of Cu(TFSI)$_2$, which can also receive electrons from a comparatively high HOMO level of a hole transport material.

The matrix materials described here are advantageously doped with strong dopants such as Cu(TFSI)$_2$. In particular, such matrix materials can be efficiently doped exclusively with extremely strong dopants, such as, for example, Cu(TFSI)$_2$. This effect is already known from the dopant Re$_2$O$_7$ to an extremely strong p-type dopant. Due to the small amount of Cu(TFSI)$_2$, which in turn results from the strong doping effect, Cu(TFSI)$_2$ offers a decisive cost advantage.

According to at least one embodiment, the component is an organic light-emitting diode.

According to at least one embodiment, the component is a solar cell, a photodetector or an organic field-effect transistor.

Further advantages, advantageous embodiments and developments will become apparent from the exemplary embodiments described below in conjunction with the figures.

FIG. 1A shows a schematic side view of a comparative example of an organic electronic component.

FIG. 1B shows a schematic side view of an exemplary embodiment of an organic electronic component described here.

FIG. 2 shows measurement data of physical properties according to a plurality of exemplary embodiments of an organic electronic component described here.

FIG. 3 shows the normalized luminance as a function of the time of comparative examples and exemplary embodiments.

In the exemplary embodiments and figures, identical or identically acting elements can in each case be provided with the same reference symbols. The elements illustrated and their size relationships among one another are not to be regarded as true to scale. Rather, individual elements such as, for example, layers, components and regions can be represented with an exaggerated size for better representability and/or for a better understanding.

FIGS. 1A and 1B each show a schematic side view of an organic electronic component, in this case of an organic light-emitting diode 100 according to a comparison example (FIG. 1A) and an embodiment (FIG. 1B).

The organic electronic component 100 of FIG. 1B has an anode 2. The anode is preferably applied to a substrate 1, for example made of glass. In particular, the substrate 1 and the anode 2 form a common layer. The anode 2 can be formed, for example, from indium tin oxide (ITO) or another transparent conductive oxide. The first layer is applied above the anode, in particular in direct mechanical contact. The first layer 3 has a first matrix material 31 and at least one dopant 32. The dopant 32 can be homogeneously distributed in the first layer. NHT51, for example, can be used as the first matrix material 31. The layer thickness of the first layer 3 can be, for example, between 5 nm or 10 nm and 20 nm inclusive. The first layer 3 can have a hole injecting effect. The second layer 4 can be arranged in direct mechanical contact over the first layer 3. The second layer 4 preferably has the same matrix material 41 as the first layer 3. The second matrix material 41 can alternatively also be different from the first matrix material 31. The layer thickness of the second layer 4 can preferably be between 50 nm and 300 nm.

An electron-blocking layer 11, at least one light-emitting layer 5, a hole-blocking layer 6, an electron-injecting layer 8 and a cathode 9 can be arranged above the second layer 4. The cathode 9, for example, can be reflective. For example, the cathode is formed from aluminium.

In comparison thereto. FIG. 1A shows an organic electronic component according to a comparative example. The component 100 of FIG. 1A differs from the component 100 of FIG. 1B in that the undoped second layer 4 is absent. For this purpose, however, the first layer 3 of the component of FIG. 1 is in particular provided with a larger layer thickness, that is to say with a layer thickness of between 50 nm and 300 nm inclusive. The component of FIG. 1A therefore has a full doping with a p-dopant for hole injection and/or hole transport in the first layer 3. In comparison thereto, the component of FIG. 1B has a so-called interface doping with a p-type dopant (first layer 3), wherein subsequently an undoped hole transport layer (second layer 4) is arranged, which is formed only from a second matrix material, that is to say without a dopant.

FIG. 2 shows measurement data of physical properties of a component according to an embodiment and of comparative examples. As an example the dopant $Cu(TFSI)_2$ (abbreviated to Cu-TFSI) is used. In principle, however, other dopants disclosed here are also possible. A p-type dopant having 3% by volume is shown as the reference R. In this case, V means that a component of FIG. 1A has been used in which the dopant content in the first layer 3 is 1% by volume, 3% by volume and 5% by volume, respectively. The last three rows of the table show a component according to an embodiment, for example according to FIG. 1B, with a different proportion of the dopant of 1% by volume to 5% by volume in the first layer 3, L, Peff, Ieff, EQE and U mean luminance (L), power efficiency (Peff), current efficiency (Ieff), external quantum efficiency (EQE) and voltage (U).

It is to be observed that a component according to the invention which has, for example, 1 vol. % Cu-TFSI can reach comparable values as a boundary surface doping as a conventional OLED having a proportion of cu-TFSI of 1 to 5% by volume and the reference of a p-type dopant having a proportion of 3% by volume.

FIG. 3 shows the normalized luminescence L/L0 as a function of the time t in hours h.

The curves 31 show a component, for example according to the embodiment of FIG. 1B, with a dopant, for example $Cu(TFSI)_2$ with a proportion of 1, 3 and 5% by volume. Curve 3-2 shows the reference of the p-type dopant with one in the proportion of 3% and the curves 3-3 show a component according to FIG. 1A, in which $Cu(TFSI)_2$ with a proportion of 1% by volume, 3% by volume or 5% by volume is used. The arrow in the curves 3-3 shows that the concentration of the dopant increases in the direction of the arrow.

It can be seen from the graphic that a clear improvement in the service life of components, in particular for OLEDs, with the dopant, for example $Cu(TFSI)_2$, can be achieved according to the embodiment. Furthermore, it can be seen from the figure that the service life is independent of the proportion of the dopant, in particular the proportion of $Cu(TFSI)_2$.

Preparation of Fluorinated Sulfonimide Metal Salts

1. Purification of Zinc Bis(Trifluoromethanesulfonimide), $Zn(TFSI)_2$ $Zn(TFSI)_2$ (CAS: 1616106-25-0) is commercially available from Sigma-Aldrich. The solid was sublimed in a high vacuum. The input weight is 800 mg, and the output weight is 156 mg. The temperature is 174 to 178° C., at a pressure of approximately $5 \cdot 10^6$ mbar. The product was obtained as a white amorphous solid.

2. Purification of Copper Bis(Trifluoromethanesulfonimide), $Cu(TFSI)_2$ $Cu(TFSI)_2 \cdot xH_2O$ (CAS: 1334406-76-6) is commercially available from Sigma-Aldrich. The solid was sublimated twice in a high vacuum. The first sublimation took place at an input weight of 580 mg and an output weight of 331 mg at a temperature of 115 to 145° C. The product was obtained as a white amorphous solid. The second sublimation took place at an input weight of 331 mg and an output weight of 266 mg at a temperature of 115 to 145° C. The product was obtained as a white amorphous solid.

3. Purification of Lithium Trifluoromethanesulfonimide, Li(TFSI)

Li(TFSI) (CAS: 9076-65-6) is commercially available from Sigma-Aldrich. The solid was distilled twice under high vacuum. The first distillation took place at an input weight of 1.2 g and an output weight of 0.92 g. The white Li(TFSI) is liquid at 225 to 230° C. and distilled at 250 to 270° C., as a white amorphous solid. The second distillation took place at an input weight of 0.92 g and an output weight of 0.40 g and a temperature of 250 to 270° C. The product is obtained as a white amorphous solid.

4. Purification of Sodium Trifluoromethanesulfonimide, Na(TFSI)

Na(TFSI) (CAS: 91742-21-1) is commercially available from Sigma-Aldrich. The solid was distilled twice under high vacuum. The first distillation took place at an input weight of 505 mg and an output weight of 410 mg. The white Na(TFSI) is liquid at 265° C., and distilled at 270 to 295° C., as a white partially crystalline solid. The second distillation took place at an input weight of 410 mg and an output weight of 270 mg and a temperature of 270 to 275° C. The product is obtained as a white solid.

5. Purification of Potassium-Trifluoromethanesulfonimide. K(TFSI)

K(TFSI) (CAS: 9076-67-8) is commercially available from Sigma-Aldrich. The solid was distilled twice in a high vacuum in the ball tube. The first distillation took place at an initial weight of 482 mg and a balance of 366 mg. The white K(TFSI) is liquid at 205° C. and distilled at 270 to 290° C. The second distillation took place at an input weight of 366 mg and an output weight of 241 mg at a temperature of 270 to 285° C.

The exemplary embodiments described in conjunction with the figures and the features thereof can also be combined with one another in accordance with further exemplary embodiments, even if such combinations are not explicitly shown in the figures. Furthermore, the exemplary embodiments described in conjunction with the figures can have additional or alternative features according to the description in the general part.

The invention is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

This patent application claims the priority of German patent application 10 2017 111 425.4, the disclosure content of which is hereby incorporated by reference.

LIST OF REFERENCE NUMERALS 1 substrate
2 anode 3 first layer
4 second layer
5 light-emitting layer
6 hole-blocking layer
7 electron-transporting layer
8 electron-injecting layer
9 cathode
10 organic electronic component
11 electron-blocking layer
100 organic light-emitting diode
31 first matrix material
32 dopant
41 second matrix material

The invention claimed is:

1. A method for producing an organic electronic component comprising the steps of:
   A) providing an anode,
   B) applying a first layer to the anode, wherein the first layer has a first matrix material and a dopant embedded therein,
   wherein the dopant is a p-type dopant comprising at least one material which has a lewis acidity completely with regard to the matrix material,
   C) applying a second layer to the first layer wherein the second layer has a second matrix material, wherein the first layer is arranged between the first layer and the anode, wherein a thickness of the second layer is greater than a thickness of the first layer,
   D) applying at least one light-emitting layer to the second layer, wherein the second layer is arranged between the anode and the at least one light emitting layer; and
   E) applying a cathode to the at least one light-emitting layer such that the light-emitting layer is arranged between the anode and the cathode.

2. The method according to claim 1,
   wherein the first layer is produced by co-deposition of the matrix material and of the dopant via physical vapour deposition.

3. The method according to claim 1,
   wherein the first layer is produced by means of a wet-chemical method.

4. The method according to claim 1,
   wherein the second layer is produced by means of physical vapor deposition or a wet chemical method.

5. The method according to claim 1, wherein the at least one material which has a lewis acidity completely with regard to the matrix material is configured to chemically bond to the matrix materials, the bond being selected from the group of covalent bonds, ionic bonds and coordinative bonds.

6. The method of claim 1, wherein the second layer is undoped.

7. The method of claim 6, wherein the thickness of the second layer is greater than a thickness of the first layer by a factor of about 2.5 to about 30.

8. The method of claim 7, wherein the second layer has a thickness of about 60 mm to about 250 mm.

9. The method of claim 6, wherein the thickness of the first layer is less than about 50 mm.

10. The method of claim 9, wherein the thickness of the first layer is about 5 mm to about 45 mm.

11. The method of claim 6, wherein the first matrix material and the second matrix material are the same material.

12. The method of claim 1, wherein the p-type dopant comprising at least one material which has a lewis acidity completely with regard to the matrix material is a fluorinated sulfonimide metal salt.

13. The method of claim 1, wherein the first layer is a hole-injection layer.

* * * * *